United States Patent
Kim et al.

(10) Patent No.: US 9,741,891 B2
(45) Date of Patent: Aug. 22, 2017

(54) EVA SHEET COMPRISING MICROPARTICLES FOR SOLAR CELL AND METHOD FOR MANUFACTURING THE SAME

(71) Applicant: LG Hausys, Ltd., Seoul (KR)

(72) Inventors: Ji Yeon Kim, Seoul (KR); Jong Hun Lee, Seongnam-si (KR); Chul-June Choi, Deajeon (KR)

(73) Assignee: LG HAUSYS, LTD., Seoul (KR)

( * ) Notice: Subject to any disclaimer, the term of this patent is extended or adjusted under 35 U.S.C. 154(b) by 196 days.

(21) Appl. No.: 14/378,445

(22) PCT Filed: Dec. 21, 2012

(86) PCT No.: PCT/KR2012/011225
§ 371 (c)(1),
(2) Date: Aug. 13, 2014

(87) PCT Pub. No.: WO2013/125779
PCT Pub. Date: Aug. 29, 2013

(65) Prior Publication Data
US 2015/0013760 A1    Jan. 15, 2015

(30) Foreign Application Priority Data

Feb. 24, 2012    (KR) .................. 10-2012-0019113

(51) Int. Cl.
*H01L 31/18* (2006.01)
*C08J 5/18* (2006.01)
*H01L 31/048* (2014.01)
*C09D 123/08* (2006.01)

(52) U.S. Cl.
CPC .............. *H01L 31/18* (2013.01); *C08J 5/18* (2013.01); *C09D 123/0853* (2013.01); *H01L 31/0481* (2013.01); *C08J 2323/08* (2013.01); *C08J 2331/04* (2013.01); *Y02E 10/50* (2013.01)

(58) Field of Classification Search
CPC ......... H01L 31/18; H01L 31/0481; C08J 5/18
USPC .......................... 136/256; 524/563; 526/331
See application file for complete search history.

(56) References Cited

U.S. PATENT DOCUMENTS 6,310,612 B1 * 10/2001 Kotsubo ................ C09J 123/08
178/18.03

FOREIGN PATENT DOCUMENTS

| | | | |
|---|---|---|---|
| JP | 02219842 A | | 9/1990 |
| JP | 08220096 A | | 8/1996 |
| JP | 2002363507 A | * | 12/2002 |
| JP | 2004224878 A | | 8/2004 |
| JP | 2004224879 A | | 8/2004 |
| JP | 2007091839 A | | 4/2007 |
| JP | 2008206550 A | | 9/2008 |
| JP | 2011023415 A | | 2/2011 |
| JP | 2011216829 A | | 10/2011 |
| JP | 103229310 A | | 7/2013 |
| KR | 20100117271 A | | 11/2010 |
| KR | 20100137634 A | | 12/2010 |
| KR | 101096430 B1 | * | 12/2011 |
| KR | 20120015552 A | | 2/2012 |
| KR | 20120055377 A | | 5/2012 |

OTHER PUBLICATIONS

Translation to KR 101096430 B1 (2011).*
Translation to JP 2002363507 (2002).*

* cited by examiner

*Primary Examiner* — Kelechi Egwin
(74) *Attorney, Agent, or Firm* — Hauptman Ham, LLP

(57) ABSTRACT

An EVA sheet for a photovoltaic module comprising microparticles, the main component of which is an ethylene-vinyl acetate resin is provided.
A method for manufacturing an EVA sheet for a photovoltaic module comprising the steps of: (a) preparing microparticles, the main component of which is an ethylene-vinyl acetate resin; (b) dispersing the microparticles; and (c) sintering the dispersed microparticles is provided.

18 Claims, 3 Drawing Sheets

(a)            (b)            (c)

EVA SHEET COMPRISING MICROPARTICLES FOR SOLAR CELL AND METHOD FOR MANUFACTURING THE SAME

TECHNICAL FIELD

The present invention provides an EVA sheet for solar cells and a method for manufacturing the same, and more particularly, an EVA sheet comprising a constant thickness by optimizing the size of microparticles in the EVA sheet by microparticle sintering methods.

BACKGROUND ART

Prior EVA sheets for solar cells are manufactured by extrusion or calendaring methods. But this has difficulties of adjusting thicknesses of the sheets, and leaves a thermal history in the EVA sheets and thus generates thermal contraction in a MD (Machine direction) direction during a modularization process of the solar cells. Also, there are problems of prolonged modularization process time from difficulties of removing bubbles due to dense structures.

Also in Korea laid-open publication No. 1-2010-0117271, a sheet manufacturing step in which a sheet is manufactured by coating extruded raw materials on a belt type calendar roll is comprised, and also in Korea laid-open publication No. 10-2010-0137634, a step in which unwinding a manufactured EVA sheet and engraving by applying pressure in room temperatures or heated temperatures by an applied embossing roll is comprised, and thus is only distinguished from prior extrusion and calendaring EVA manufacturing methods, and there are no disclosures of any solutions to overcome the problems described above.

DISCLOSURE

Technical Problem

To solve the problems described above, the present invention provides a method for manufacturing an EVA sheet for a photovoltaic module in which the size of microparticles are optimized so that it may have a uniform degree of dispersion to manufacture an EVA sheet having a constant thickness after modularization.

Technical Solution

To achieve an objective described above, an EVA sheet for a photovoltaic module comprising microparticles, the main component of which is an ethylene-vinyl acetate resin is provided.

To achieve another above described objective, a method for manufacturing an EVA sheet for a photovoltaic module comprising (a) preparing microparticles, the main component of which is an ethylene-vinyl acetate resin; (b) dispersing the microparticles; and (c) sintering the dispersed microparticles is provided.

Advantageous Effects

Since microparticles comprised by an EVA sheet for solar cells in accordance with the present invention are based on microparticle sintering methods, gas pockets exist to some degree and may decrease bubble removal time, and thus having advantages of reducing modularization process time and easily adjusting the thickness of the EVA sheet.

Also, as a method for manufacturing an EVA sheet for solar cells using microparticles, damage of cells of solar cells during the modularization process may be blocked compared to extrusion and calendaring methods since the initial thickness before modularization is about two times thicker than the thickness after modularization or the thickness after a lamination process.

DESCRIPTION OF DRAWINGS

FIG. 2 shows experimental results corresponding to thermal contraction ratios of EVA sheets of Examples photographed as photos, wherein FIG. 2(a) shows Example 1, FIG. 2(b) shows Example 2, FIG. 2(c) shows Comparative example 1, FIG. 2(d) shows Comparative example 2, and FIG. 2(e) shows Comparative example 3.

BEST MODE

Figure 1:
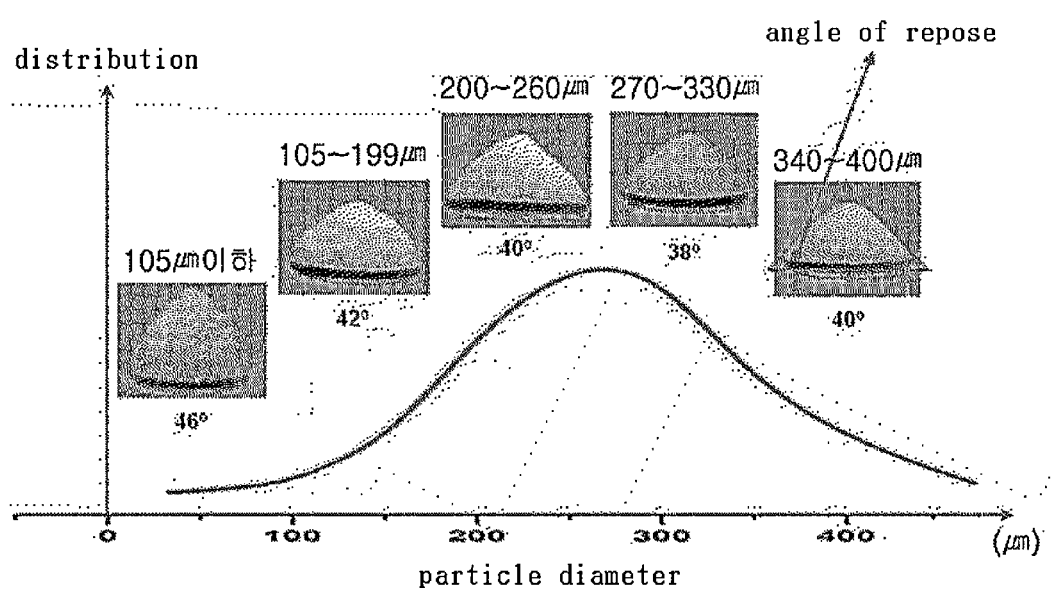
FIG. 1 is a graph showing distribution and angle of repose of particles in accordance with sizes of particles after freeze pulverizing.

Advantages and features of the present invention, and method for achieving thereof will be apparent with reference to the following examples. But, it should be understood that the present invention is not limited to the following examples and may be embodied in different ways, and that the examples are given to provide complete disclosure of the invention and to provide thorough understanding of the invention to those skilled in the art, and the scope of the invention is limited only by the accompanying claims and equivalents thereof. Like components will be denoted by like reference numerals throughout the specification.

Hereinafter, the present invention is described in detail.
An EVA Sheet for Solar Cells The present invention provides an EVA sheet for a photovoltaic module comprising microparticles, the main component of which is an ethylene-vinyl acetate resin (referred to as EVA below).

The EVA resin is ethylene-vinyl acetate and its physical properties are determined from the degree of polymerization and the amount of vinyl acetate. As molecular weight becomes greater, toughness and plasticity, scratch cracking resistance, and impact resistance are improved, and moldability and surface glossiness are reduced. Meanwhile, when the amount of vinyl acetate increases, density and rubber elasticity, compatibility of a polymer with a different flexibility or a plasticizer are increased and softening temperature is reduced.

The amount of vinyl acetate of the EVA resin, which is a main component of particles of the present invention, is 25 to 35% by weight. When the amount of vinyl acetate of EVA resin used in the present invention is less than 25% by weight, transparency decreases and thus solar transmittance decreases and adhesiveness reduces and thus is not preferable, and when exceeding 35%, viscosity increases and thus workability reduces and thus is not preferable.

Also, particles having the ethylene-vinyl acetate resin of the present invention as a main component may exist in a fused state with each other. With respect to the method for manufacturing the EVA sheet of the present invention, by comprising a sintering step, a portion of microparticles may be fused, more specifically, may exist in microparticle forms, or multiple of one or more microparticles may exist in a fused state with each other, and microparticles and microparticles fused with each other may exist together.

As it comprises microparticles comprising the EVA resin as a main component, a crosslinking agent, a co-crosslinking agent, a UV blocking agent, etc. may be further comprised in the EVA resin. By adding the additives to the EVA resin, discoloration of the EVA sheet, alteration from UV and modularization may be minimized.

The additives comprise a crosslinking agent, or a UV blocking agent, etc., but other additives may be further be comprised according to needs. Specifically, a silane coupling agent, a lubricant, an antioxidant, a flame retardant, a discoloration preventing agent, etc may be exemplified for the additive.

For an example of peroxiketal used for the additive in the present invention, 1,1-di(tert-amyl peroxy)cyclohexane, 1,1-di(tert-butylperoxy)-3,3,5-trimethyl cyclohexane, and 1,1-di(tert-butylperoxy)cyclohexane may be used, and for an example of a peroxycarbonate, 2,5-dimethyl-2,5-di-(2-ethylhexanonylperoxy)hexane, tert-amyl peroxy-2-ethyl hexanoate, tert-butylperoxy-2-ethylhexanoate, tert-amyl(2-ethylhexyl)monoperoxycarbonate, tert-butyl isopropyl monoperoxycarbonate, 2,5-dimethyl-2,5-di(benzoylperoxy) hexane, tert-butyl-(2-ethylhexyl)monoperoxycarbonate, tert-amylperoxybenzoate, tert-butylperoxyacetate, tert-butylperoxy-3,5,5-trimethylhexanoate, and tert-butylperoxybenzoate may be used.

The amount used for the crosslinking agent is preferable to be 0.1 to 5 parts by weight to 100 parts by weight based on the EVA resin, and when comprising less than 0.1 of the crosslinking agent, it is difficult to reach the target degree of gelation when forming the EVA sheet, and there are problems of taking a great amount of time, and when exceeding 5 parts by weight, there are concerns of yellowing from UV occurring from consuming a great amount of UV blocking agents due to radicals from the crosslinking agent.

Also, a co-crosslinking agent may be used with the crosslinking agent, the co-crosslinking agent may comprise triethylene glycol dimethacrylate, tetraethylene glycol dimethacrylate, trimethylpropane trimethacrylate, divinylbenzene, ethyleneglycol dimethacrylate, pentaerythritol triacrylate, trimethylolpropane triacrylate, and triallylisocyanurate. The amount used for the co-crosslinking agent is preferable to be 0.1 to 3 parts by weight to 100 parts by weight based on the EVA resin, and when comprising less than 0.1 of the co-crosslinking agent, it brings about reduction in crosslinking speeds and crosslinking densities, and as a result there are concerns of reduction in durability and thermal resistance, and when exceeding 3 parts by weight, there are problems of reduction in flexibility.

A UV absorbent or a UV stabilizer may be comprised for the UV blocking agent. For the UV absorbent, at least one selected from 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, and 2,2',4,4'-tetrahydroxybenzophenone may be used, and for the UV stabilizer, at least one selected from 4-methoxyphenyl-methylene-bis-1,2,2,6,6-4-piperidinylsebacate, bis-2,2,6,6,-tetramethyl-4-piperidinylsebacate, bis-1-methyl-2,2,6,6,-tetramethyl-4-piperidinylsebacate, 2-(2'hydroxy-3',5'-ditertbutylphenyl)benzotriazole, 2-(2-hydroxy-3,5-di-tert-amylphenyl)-2H-benzotriazole, and polymethylpropyl-3-oxo-(4(2,2,6,6,-tetramethyl-4-piperidinyl)siloxane may be used.

The amount used for the UV blocking agent is preferably to be 0.1 to 3 parts by weight. When adding less than 0.1 parts by weight of the UV blocking agent, securing long term weather resistance is difficult due to yellowing of the EVA sheet being induced by the UV.

Also, when the UV blocking agent is comprised in excess by exceeding 3 parts by weight, discoloration of the EVA resin may occur. In the case of the solar cells, it has to maintain its efficiency for a long periods of time of about 20 years, and when the EVA sheet becomes yellowing, it may reduce the efficiency of the solar cells by blocking solar light incident to the cells of the solar cells due to the reduction in transmittance of solar light.

A silane coupling agent, a lubricant, an antioxidant, a flame retardant, a discoloration preventing agent, etc. may be comprised for various additives, and the silane coupling agent may be used for improving adhesiveness between the manufactured EVA sheet and a glass or a cell, specifically, at least one selected from $\gamma$-methacryloxypropyltrimethoxylsilane, N-($\beta$-aminoethyl)-$\gamma$-aminopropyltrimethoxylsilane, N-($\beta$-aminoethyl)-$\gamma$-aminopropylmethyldimethoxylsilane, $\gamma$-aminopropyltriethoxylsilane, $\gamma$-glycidoxypropyltrimethoxysilane may be used, and the amount used is preferable to be 0.01 to 0.5 parts by weight to 100 parts by weight based on the EVA resin for each region.

The microparticles have a mean particle diameter of 200 to 400 μm. With respect to the method for manufacturing the EVA sheet by a microparticle sintering method, to disperse microparticles in a constant thickness, at least 2 other microparticles should be able to be laminated on the microparticle to have a stable structure. Therefore, the limitation of size of microparticles is an important element with respect to the microparticle sintering methods.

When the mean particle diameter of the microparticles is less than 200 μm, there are concerns of the modularization process time being prolonged due to decrease of pores from increase in compactness of the EVA sheet, and when exceeding 400 μm, the thickness of the final EVA sheet may be influenced. Especially, the EVA resin has properties of absorbing moisture and since it is easy for the microparticles to aggregate, adjusting the particle size of the microparticles is additionally important. Therefore, when the mean particle diameter of the microparticles is less than 100 μm, flowability may greatly drop, thus maintaining the mean particle diameter to at least 200 to 300 μm is most preferable.

Furthermore, the microparticle sintering method comprised in the method for manufacturing of the present invention requires microparticles with appropriate sizes, and this is because the microparticles allows pores to exist to some degree in the EVA sheet, and thus bubble removal time in the solar cell modularization process is made to be reduced compared to ≙ EVA sheet structure of a compact structure from extrusion or calendering methods.

Also, the microparticles have an angle of repose of 40° or less. The angle of repose in the present invention describes the maximum inclination angle maintaining the inclination when particles are stacked on a horizontal plate, that is, when molecular particles are stacked, and describes the angle formed by its slope and the horizontal surface. A discharge method, a free fall method, an injection method, an inclination method, etc. may be used for the measurement method for the angle of repose. Measuring the angle of repose is to identify the characteristics of powders not identified from chemical analysis or grain size analysis, and the angle of repose may get larger as the particle diameter of the microparticles gets smaller, or more angular. As the flowability of the microparticles is able to be predicted from the angle of repose, the EVA resin has properties of absorbing moisture, and since it is easy for microparticles to aggregate, the particle size of the microparticles may be important with respect to adjusting the angle of repose. The angle of repose differs greatly according to the size of the microparticles, and in the case of the microparticles becoming too small, it does not flow well due to moisture absorption properties of the EVA resin and particles may stick with each other.

Therefore, by having the angle of repose with respect to the limited mean particle diameter of the microparticles to 40° or less, adequate flowability may be secured, and a sintered EVA sheet having uniform degree of dispersion may be manufactured.

The EVA sheet for a photovoltaic module of the present invention has a thickness of 250 to 400 μm. Compared to having no choice but to manufacture EVA sheets comprising thickness of 450 μm from extrusion or calendaring methods in the case of prior EVA sheets, in the case of the EVA sheet of the present invention comprising microparticles having ethylene-vinyl acetate resin as its main component, solar cell damage may be better prevented from maintaining the initial thickness to a thick thickness by microparticles being dispersed, and excellent effects in thermal contraction ratio may be shown even when having a thinner final thickness after the modularization process.

Method for Manufacturing EVA Sheet for Solar Cell Modules

The present invention comprises a method for manufacturing an EVA sheet for a photovoltaic module comprising (a) preparing microparticles, the main component of which is an ethylene-vinyl acetate resin; (b) dispersing the microparticles; and (c) sintering the dispersed microparticles.

The method for manufacturing the EVA sheet of the present invention is a differentiated method from prior extrusion or calendaring methods and comprises the method for manufacturing microparticles by freeze pulverizing the compound of the EVA resin and the additives and dispersing and sintering the same. Here, it is important to decide the size of the microparticles to make a sheet with a specific thickness having a uniform degree of dispersion. Here, it may freeze pulverize by further comprising 0.1 to 5 parts by weight of the crosslinking agent, 0.1 to 3 parts by weight of the co-crosslinking agent, and 0.1 to 3 parts by weight of the UV blocking agent to 100 parts by weight based on the ethylene-vinyl acetate resin. Here, the freeze pulverizing is performed at temperatures of −150 to −100° C. The size of microparticles may be adjusted according to freeze pulverizing temperatures, but when freeze pulverizing under −150° C., the size of the pulverized microparticles becomes smaller and thus compactness of the EVA sheet after the sintering process increases and removing bubbles during the modularization process is difficult, and when freeze pulverizing over −100° C., the size of the microparticles become larger, and there are concerns of having to pulverize the microparticles again.

The method for manufacturing the EVA sheet for a photovoltaic module of the present invention comprises dispersing the microparticles manufactured from the freeze pulverizing step. Here, the microparticles are dispersed in a thickness of 750 to 1,200 μm. This is one of the process conditions for manufacturing the EVA sheet comprising constant thicknesses, and when the microparticles are dispersed in a thickness of less than 750 μm, the minimum thickness of the EVA sheet that may protect the cell from impact during the modularization process may not be secured, and when scattering in a thickness over 1,200 μm, there are concerns of tiny cracks occurring on the cells due to pressurization in the modularization process.

The EVA sheet manufactured from the microparticle sintering process is finally manufactured as a compact sheet without pores from an initial structure of having many pores, and uniformly dispersing the microparticles in the initial step is required. This is because when it does not become a compact structure in the final state due to ununiform dispersion of the microparticles, prevention characteristics of moisture transmittance prevention, etc. drop and as a result efficiency of the solar cells drops. Therefore, more specifically, at least two or more microparticles should be uniformly arranged in a horizontal direction.

Further, by maintaining the uniform degree of scattering of the microparticles, the thickness before modularization is thicker than the thickness after lamination and thus cell damage of solar cells in the modularization process may be prevented.

As a result, the microparticle sintering method is a method uniformly dispersing the manufactured microparticles from freeze pulverizing, and manufacturing the EVA sheet with a thin thickness, which was difficult to attempt in prior extrusion or calendaring methods, is possible. More specifically, prior extrusion or calendaring methods comprise a process pulling the sheet when heat is applied and rolling on a roll, and tension is applied in a MD direction on the EVA sheet, and thus contraction occurs during the lamination process by properties trying to go back to its original state when the sheet is heated. The arrangement of cells of the solar cells becomes distorted and thus there are concerns of efficiency declining. But in the case of the EVA sheet in accordance with the microparticle sintering method of the present invention does not comprise the elongation process, and thus contraction during the process does not occur.

Hereinafter, configurations and effects of the present invention are further described in detail through preferred examples of the present invention. But, the following examples are provided as preferred examples of the present invention and the scope of the present invention is not limited to these. Contents not presented here may be inferred by those skilled in the arts and its description is skipped.

Experimental Example 1

Freeze Pulverizing/Particle Size Optimization 1 kg of an EVA resin (Photovoltaic PV1300Z/DuPont) and an additive composed of 2 parts by weight of a crosslinking agent (t-Butyl 1-(2-ethylhexyl)monoperoxycarbonate, TBEC), 2 parts by weight of a co-crosslinking agent (triallylIsocyanurate, TAIC), 0.3 parts by weight of a silane coupling agent (3-(methacryloxypropyl)trimethoxysilane, KBM 503), 0.2 parts by weight of a lubricant (glycerin tri-18-hydroxystearate, TG-12), 0.25 parts by weight of a UV stabilizer (4-methoxyphenyl-methylene-bis-1,2,2,6,6-pentamethyl-4-piperidinylsebacate, PR31), and 0.25 parts by weight of a UV absorbent (2-Hydroxy-4-octoxy benzophenone, UV531) corresponding to 100 parts by weight of the EVA resin was freeze pulverized at a temperature of −120° C. by consuming 5 kg of liquid nitrogen and microparticles having particle diameters of 50 to 450 μm was prepared.

Referring to FIG. 1, the microparticles obtained through the freeze pulverizing showed a distribution of particle diameters of 50 to 450 μm, but as the microparticles having particle diameters of 200 to 400 μm were distributed the most, the mean particle diameter of the microparticles being 200 to 400 μm was observed. When examining in more detail, when microparticles having particle diameters of less than 105 μm are manufactured, this has to be recompounded, and when microparticles having particle diameters of 105~199 μm are manufactured, a separate silica treatment is required, and also, when microparticles having particle diameters of over 400 μm are manufactured, its size is too large and the microparticles must be reperverized. Therefore, mean particle diameter of 200~400 μm being the optimal particle size of the microparticles is reasonable.

Also, the angle of repose in accordance with the particle diameter of the microparticles was measured, the measurement of the angle of repose was by a circular cone obtained by passing a fixed volume of the microparticles composing the EVA sheet through a special cone fastened to a fixed height on a reference plate, which is a complete flat surface. The microparticles were piled in a cone shape and when overflowing, its supply was stopped, and the angle was measured using a digital angle ruler (aru200, Angelo), and the mean value of the angle of repose was obtained by measuring 3 different points.

Here, referring to FIG. 1, the angle of repose of the microparticles in accordance with particle diameters of the microparticles is shown, the microparticles with particle diameters of less than 105 μm showed the angle of repose of 46°, the microparticles with particle diameters of 105~199 μm showed the angle of repose of 42°. Apart from this, the microparticles with particle diameters of 200 to 260 μm, 270 to 330 μm, and less than 340 to 400 μm showed the angles of repose of 40°, 38°, and 40°, the angle of repose of the microparticles obtained from freeze pulverizing having particle diameters of 200~400 μm being less than 40° or less was observable. As such, an optimal flowability with respect to the following dispersing the microparticles step was obtainable from the microparticles having a uniform angle of repose.

Experimental Example 2

EVA Sheet Thickness Optimization

The freeze pulverized microparticles of the Experimental example 1 was scattered in a thickness of 1,200 μm, and the dispersed microparticles were sintered for 1 minute at 100° C. The sintered microparticles were laminated at temperatures of Examples 1 to 4 of the following Table 1, and the EVA sheets having uniform thicknesses were manufactured.

Here, Comparative example 1 is a Hanhwa EVA sheet (1628-EVA), Comparative example 2 is a SK EVA sheet (EF2N), and Comparative example 3 is a B/S EVA sheet (EVASKY), which are EVA sheets manufactured by extrusion and calendaring methods.

In the present Experimental example, vapor permeability of the EVA sheets was measured to verify the amount of moisture permeability of the EVA sheet manufactured by the method for manufacturing of the present invention, the vapor permeability in this case was measured by using the mass of moisture permeating for 24 hours in conditions of 38° C., RH 90%.

TABLE 1

| | Lamination temperature (° C.) | EVA sheet thickness (μm) | Vapor permeability (g/m² · 24 hr) |
|---|---|---|---|
| Example 1 | 150 | 400 | 19.555 |
| Example 2 | 160 | 400 | 19.716 |
| Example 3 | 150 | 250 | 27.930 |
| Example 4 | 160 | 250 | 24.228 |
| Comparative example 1 | 150 | 500 | 14.817 |
| Comparative example 2 | 150 | 450 | 21.50 |
| Comparative example 3 | 160 | 500 | 14.945 |

The vapor permeability is a numerated property of physically emitting moisture in a vapor form inside the EVA sheet, and according to the Table 1, the vapor permeability of Examples 1 to 4 and Comparative examples 1 to 3 were measured to be identical. But, the final thickness of the EVA sheets of Comparative examples 1 to 3, which were manufactured by extrusion or calendering methods, being thicker than Examples 1 to 4 was observed.

As a result, since the vapor permeability of Examples 1 to 4 and Comparative examples 1 to 3 were measured to be not that much different, the vapor permeability is somewhat well achieved, and the pores exist to some degree due to the microparticles, and the pore removal process time being able to be further reduced compared to compact structures was verifiable. Also, being able to manufacture thin EVA sheets by adjusting the thickness through the microparticle sintering methods, not the extrusion or calendaring methods, was verified.

Experimental Example 3

Degree of Thermal Contraction of EVA Sheet Measurement

The degree of thermal contraction was measured by manufacturing the EVA sheets of Examples 1 to 4 and Comparative examples 1 to 3 of the Experimental example 2 to 20 cm×20 cm (width×height) and left alone for 3 minutes in hot water of 78° C., followed by measuring its size.

TABLE 2

| | EVA sheet thickness (μm) | Contraction ratio (%) |
|---|---|---|
| Example 1 | 400 | 0 |
| Example 2 | 400 | 0 |
| Example 3 | 250 | 0 |
| Example 4 | 250 | 0 |
| Comparative example 1 | 500 | 4.6 |
| Comparative example 2 | 500 | 2 |
| Comparative example 3 | 450 | 1 |

As a result, the contraction ratio of the Examples 1 to 4 was measured to be close to 0%, the EVA sheet for a photovoltaic module of the present invention having good durability as it is not influenced by heat even when exposed to heat, etc. was verified. But, compared to this, the contraction ratio of the EVA sheets of Comparative examples 1 to 3 was measured to be higher than Examples 1 to 4, thus it having changes from heat was observable.

This is because, in the case of the Comparative examples 1 to 3, they are manufactured from normal extrusion and calendering methods, not the microparticle sintering method, and thus contraction, in which it tries to go back to its original sheet shape due to comprising an elongation process in the manufacturing process, occurs. But, in the case of the Examples 1 to 4, they are non-elongation sheets not comprising the elongation process in the manufacturing process and thus differs in that it does not generate contraction.

Figure 2:
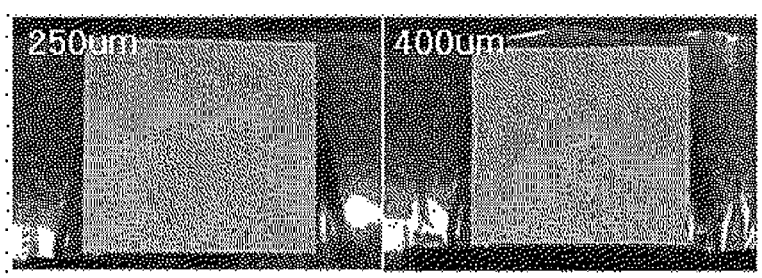
Figure 3:
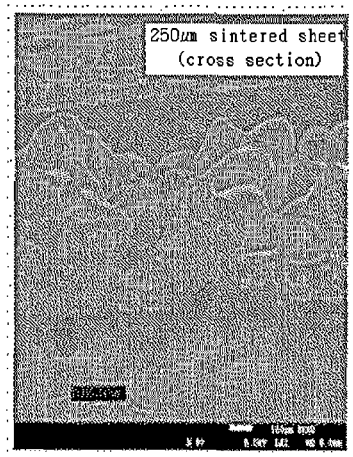
FIG. 3 shows (a) a cross section, (b) a surface, and (c) a cross section of a laminated EVA sheet of an EVA sheet with a thickness of 250 μm comprising microparticles with a particle size of 385.547 μm photographed by SEM
Figure 3:
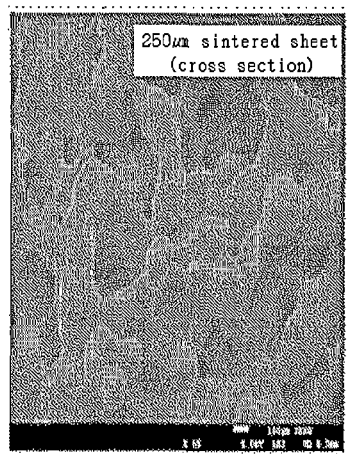
Figure 3:
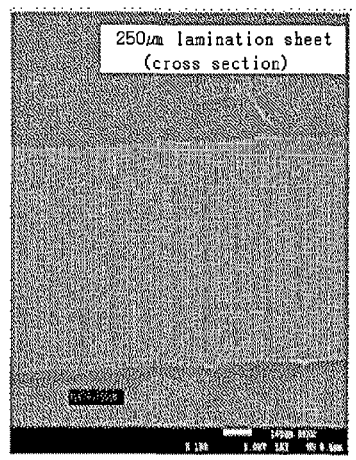

Referring to FIG. 2, experimental results corresponding to thermal contraction ratios of the EVA sheets photographed as photos of Example 1 is shown in FIG. 2(a), Example 2 in FIG. 2(b), Comparative example 1 in FIG. 2(c), Comparative example 2 in FIG. 2(d), and Comparative example 3 in FIG. 2(e). The EVA sheets of Example 1 and Example 2 having no change from heat was observed, but on the other hand, in the case of Comparative examples 1 to 3, EVA sheets becoming crumpled, or having wrinkles and thus not being able to maintain its initial EVA sheet form was observed. Especially, there were much contraction in mechanical directions (MD direction) in which process where elongation is generated during the manufacturing process progress. Referring to FIG. 3, FIG. 3 comprises microparticles with particle diameters of 385.547 μm, and (a) a cross section, (b) a surface, and (c) a cross section of a laminated EVA sheet of an EVA sheet with a thickness of 250 μm photographed by SEM. Since the EVA sheet is manufactured by using the microparticles, as shown in (a), (b), pores exist to some degree, but the EVA sheet with a uniform shape after lamination was verified.

The invention claimed is:

1. An EVA sheet for a photovoltaic module, the EVA sheet comprising:
    microparticles, sintered at 100° C., and a main component of which is an ethylene-vinyl acetate resin including 25% to 35% of vinyl acetate by weight based on the ethylene-vinyl acetate resin,
    wherein a mean particle diameter of the microparticles is 200 μm to 400 μm, an angle of repose of the microparticles is 40° or less, the microparticles are sintered at 100° C. prior to being laminated to form the EVA sheet, and the EVA sheet has a contraction ratio of 0%.

2. The EVA sheet for a photovoltaic module according to claim 1, wherein the microparticles exist in a fused state with each other.

3. The EVA sheet for a photovoltaic module according to claim 1, wherein the microparticles further comprise 0.1 to 5 parts by weight of a crosslinking agent, 0.1 to 3 parts by weight of a co-crosslinking agent, and 0.1 to 3 parts by weight of a ultraviolet ray blocking agent to 100 parts by weight based on the ethylene-vinyl acetate resin.

4. The EVA sheet for a photovoltaic module according to claim 1, wherein a thickness of the EVA sheet is 250 μm to 400 μm.

5. The EVA sheet for a photovoltaic module according to claim 1, wherein the microparticles comprise at least one additive selected from the group consisting of a crosslinking agent, a co-crosslinking agent, an ultraviolet ray blocking agent, a silane coupling agent, a lubricant, an antioxidant, a flame retardant, or a discoloration preventing agent.

6. The EVA sheet for a photovoltaic module according to claim 5, wherein the ultraviolet ray blocking agent comprises an ultraviolet absorbent or an ultraviolet stabilizer.

7. The EVA sheet for a photovoltaic module according to claim 6, wherein the ultraviolet absorbent comprises at least one selected from the group consisting of 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, and 2,2',4,4'-tetrahydroxybenzophenone.

8. The EVA sheet for a photovoltaic module according to claim 6, wherein the ultraviolet stabilizer comprises at least one selected from the group consisting of 4-methoxyphenyl-methylene-bis-1,2,2,6,6-pentamethyl-4-piperidinylsebacate, bis-2,2,6,6,-tetramethyl-4-piperidinylsebacate, bis-1-methyl-2,2,6,6,-tetramethyl-4-piperidinylsebacate, 2-(2'hydroxy-3',5'-ditertbutylphenyl)benzotriazole, 2-(2-hydroxy-3,5-di-tert-amylphenyl)-2H-benzotriazole, and polymethylpropyl-3-oxo-(4(2,2,6,6,-tetramethyl-4-piperidinyl)siloxane.

9. The EVA sheet for a photovoltaic module according to claim 5, wherein the lubricant is glycerin tri-18-hydroxystearate.

10. The EVA sheet for a photovoltaic module according to claim 5, wherein the crosslinking agent comprises a peroxiketal.

11. The EVA sheet for a photovoltaic module according to claim 10, wherein the peroxiketal comprises 1,1-di(tert-amyl peroxy)cyclohexane, 1,1-di(tert-butylperoxy)-3,3,5-trimethyl cyclohexane, or 1,1-di(tert-butylperoxy)cyclohexane.

12. The EVA sheet for a photovoltaic module according to claim 5, wherein the co-crosslinking agent comprises triethylene glycol dimethacrylate, tetraethylene glycol dimethacrylate, trimethylpropane trimethacrylate, divinylbenzene, ethyleneglycol dimethacrylate, pentaerythritol triacrylate, trimethylolpropane triacrylate, or triallylisocyanurate.

13. The EVA sheet for a photovoltaic module according to claim 1, wherein the microparticles are sintered at 100° C. for 1 minute prior to being laminated to form the EVA sheet.

14. The EVA sheet for a photovoltaic module according to claim 1, wherein the contraction ratio is determined by immersing the EVA sheet in water for 3 minutes at about 78° C.

15. A method for manufacturing an EVA sheet for a photovoltaic module, the method comprising the steps of:
    (a) preparing microparticles, the main component of which is an ethylene-vinyl acetate resin including 25% to 35% of vinyl acetate by weight based on the ethylene-vinyl acetate resin,
    (b) dispersing the microparticles having a mean particle diameter of 200 μm to 400 μm; and
    (c) sintering the dispersed microparticles at 100° C.,
    (d) laminated the sintered microparticles to form the EVA sheet,
    wherein an angle of repose of the microparticles is 40° or less, and the EVA sheet is formed having a contraction ratio of 0%.

16. The method for manufacturing an EVA sheet for a photovoltaic module according to claim 15, wherein in the step (a), the microparticles are manufactured by freeze pulverizing.

17. The method for manufacturing an EVA sheet for a photovoltaic module according to claim 16, wherein the freeze pulverizing is performed at temperatures of −150° C. to −100° C.

18. The method for manufacturing an EVA sheet for a photovoltaic module according to claim 15, wherein in the step (b), the microparticles are dispersed in a thickness of 750 μm to 1,200 μm.

* * * * *